United States Patent
Atesoglu

(10) Patent No.: US 9,287,825 B2
(45) Date of Patent: Mar. 15, 2016

(54) INDUCTIVE-CAPACITIVE (LC) VOLTAGE CONTROLLED OSCILLATOR (VCO) HAVING TUNING RANGE CONTROLLED BY A DIGITAL-TO-ANALOG CONVERTER (DAC) WITH PROGRAMMABLE TAIL CURRENT

(71) Applicant: Avago Technologies General IP (Singapore) Pte. Ltd., Singapore (SG)

(72) Inventor: Ali Atesoglu, Milpitas, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 25 days.

(21) Appl. No.: 14/224,190

(22) Filed: Mar. 25, 2014

(65) Prior Publication Data
US 2015/0280645 A1    Oct. 1, 2015

(51) Int. Cl.
*H03B 5/08* (2006.01)
*H03B 5/12* (2006.01)
*H03B 1/00* (2006.01)

(52) U.S. Cl.
CPC ................ *H03B 5/1253* (2013.01); *H03B 1/00* (2013.01)

(58) Field of Classification Search
CPC .............................. H03B 1/00; H03B 5/1253
USPC ............... 331/177 V, 167, 117 R, 117 FE
See application file for complete search history.

(56) References Cited

U.S. PATENT DOCUMENTS

| | | | |
|---|---|---|---|
| 7,336,134 B1 * | 2/2008 | Janesch | H03L 7/0991 331/117 R |
| 8,134,417 B2 | 3/2012 | Chiang et al. | |
| 2010/0271144 A1 * | 10/2010 | McCorquodale et al. | 331/117 FE |
| 2011/0316639 A1 | 12/2011 | Fischette | |

OTHER PUBLICATIONS

Kratyuk et al.; A 0.6GHz to 2GHz Digital PLL with Wide Tracking Range; IEEE 2007 Custom Integrated Circuits Conference (CICC), pp. 305-308; 2007.

* cited by examiner

*Primary Examiner* — Arnold Kinkead

(57) ABSTRACT

A device includes an inductive-capacitive voltage controlled oscillator (LC-VCO) having a tank circuit and programmable tail current, and a control circuit configured to adjust the tail current based on an amount of capacitance provided to the tank circuit.

18 Claims, 4 Drawing Sheets

INDUCTIVE-CAPACITIVE (LC) VOLTAGE CONTROLLED OSCILLATOR (VCO) HAVING TUNING RANGE CONTROLLED BY A DIGITAL-TO-ANALOG CONVERTER (DAC) WITH PROGRAMMABLE TAIL CURRENT

BACKGROUND

As communication technology becomes increasingly advanced, transceiver and receiver system blocks are becoming more and more complicated to design for system-on-chip (SOC) applications. Most of the high speed receivers and transceivers used in such SOC communication systems utilize an inductive-capacitive (LC) voltage controlled oscillator (VCO) (LC-VCO) for clock signal generation. As clock frequency rates continue to increase, the tuning frequency range of the LC-VCO has become one of the most challenging issues for designing receivers and transceivers. Therefore, it would be desirable to increase the tuning range of the LC-VCO.

SUMMARY

In an embodiment, a device comprises an inductive-capacitive voltage controlled oscillator (LC-VCO) having a tank circuit and programmable tail current, and a control circuit configured to adjust the tail current based on an amount of capacitance provided to the tank circuit.

Other embodiments are also provided. Other systems, methods, features, and advantages of the invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

In an exemplary embodiment, the LC-VCO having a tuning range controlled by a digital-to-analog converter (DAC) with programmable tail current can be implemented using any LC oscillator configured to generate a differential signal output.

As used herein, the term "differential signal" refers to signals that are represented by two complementary signals on different conductors, with the term "differential" representing the difference between the two complementary signals. The two complementary signals can be referred to as the "true" or "t" signal and the "complement" or "c" signal.

Figure 1:
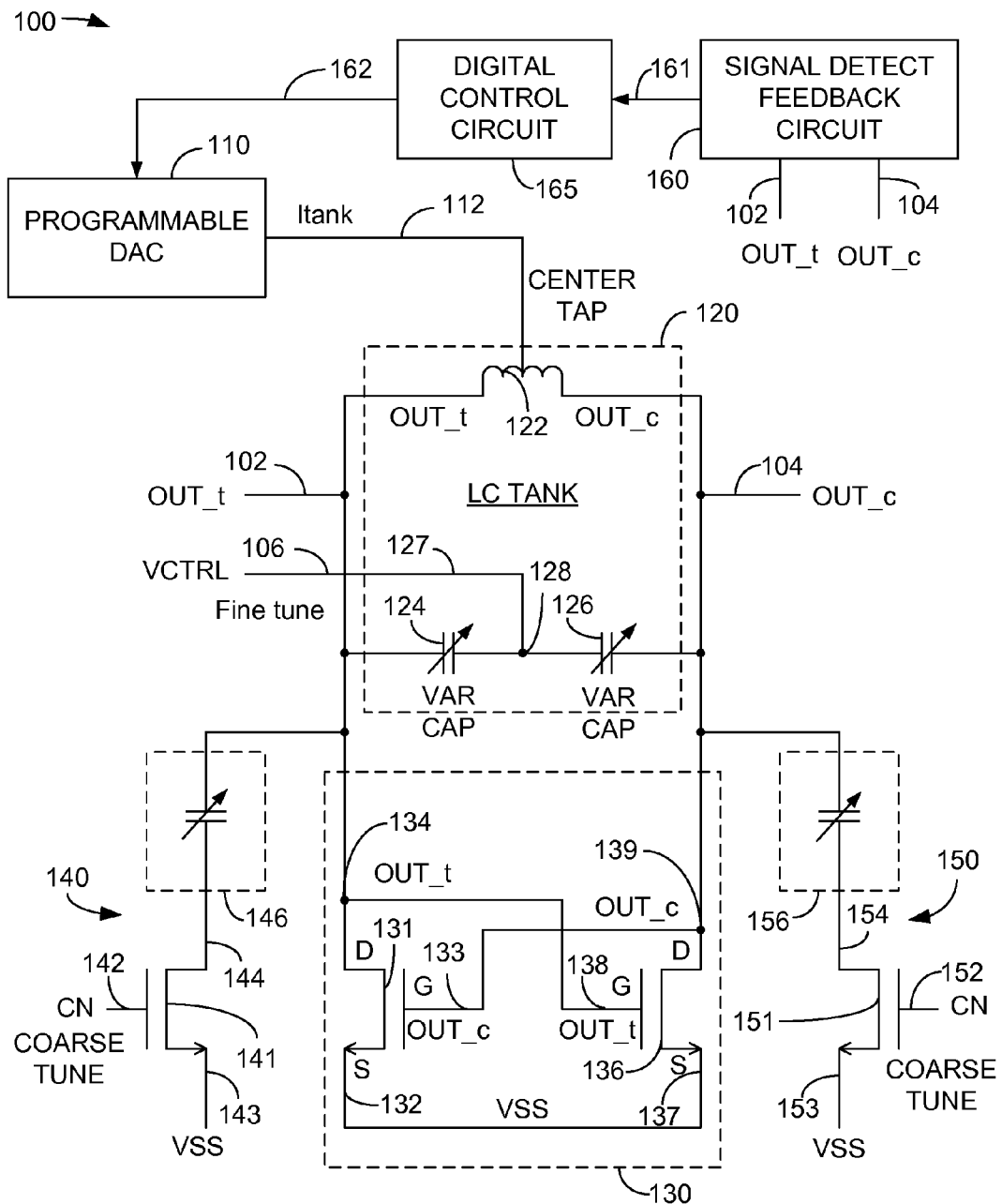
FIG. 1 is a schematic view illustrating an example of an LC-VCO circuit.

FIG. 1 is a schematic view illustrating an example of an LC-VCO circuit 100. The circuit 100 is an example of one possible implementation of an LC-VCO employing exemplary embodiments of the LC-VCO having a tuning range controlled by a digital-to-analog converter (DAC) with programmable tail current. The circuit 100 comprises a programmable digital-to-analog converter (DAC) 110 coupled to a tank circuit 120. In an exemplary embodiment, the tank circuit 120 is an inductive-capacitive (LC) circuit, and comprises an inductance 122, and adjustable voltage controlled capacitances 124 and 126. The inductance 122 is configured as a center tapped inductor and receives a tail current, referred to as Itank, from the programmable DAC 110 over connection 112.

The adjustable voltage controlled capacitances 124 and 126 receive a control voltage, VCTRL, over connection 106. The control voltage, VCTRL, provides a fine tuning function for the tank circuit 120 and is applied to a node 128 between the capacitances 124 and 126. The adjustable voltage controlled capacitances 124 and 126 are also referred to as varactors.

The circuit 100 also comprises a transconductance (gm) amplifier stage 130. The gm stage 130 comprises a transistor 131 and a transistor 136. In an exemplary embodiment, the transistors 131 and 136 can be implemented using n-type metal oxide semiconductor (NMOS) technology. In an exemplary embodiment in which a differential output is provided from the circuit 100, the transistor 131 can provide the "true" or "t" output from its drain 134 and the transistor 136 can provide the "complement" or "c" output from its drain 139. The transistors 131 and 136 are also referred to as being "cross-coupled" because the output of the transistor 131 on the drain 134 is also provided as an input to the gate 138 of the transistor 136. Similarly, the output of the transistor 136 on the drain 139 is also provided as an input to the gate 133 of the transistor 131. The source 132 of the transistor 131 is connected to the source 137 of the transistor 137 at a system voltage VSS.

The circuit 100 also comprises a coarse tune circuit 140 coupled to the "t" output, OUT_t, of the transistor 131; and a coarse tune circuit 150 coupled to the "c" output, OUT_c, of the transistor 136. The coarse tune circuit 140 comprises a transistor 141 and a capacitive network 146. The source 143 of the transistor 141 is coupled to the system voltage VSS. The gate 142 of the transistor 141 is configured to receive a coarse tune control signal, CN, and the drain 144 of the transistor 141 is coupled to the capacitive network 146.

The coarse tune circuit 150 comprises a transistor 151 and a capacitive network 156. The source 153 of the transistor 151 is coupled to the system voltage VSS. The gate 152 of the transistor 151 is configured to receive a coarse tune control signal, CN, and the drain 154 of the transistor 151 is coupled to the capacitive network 156. The capacitive network 146 and the capacitive network 156 may each comprise a bank of switchable metal-insulator-metal (MIM) capacitances, and in an exemplary embodiment, the capacitive network 146 and the capacitive network 156 may each comprise a bank of 16 switchable MIM capacitances.

The control voltage, VCTRL, provided over connection 106 can originate from a charge pump (not shown) and can be used as a "fine tune" adjustment to vary the value of the voltage controlled capacitances 124 and 126 so that the circuit 100 can reach its desired oscillation frequency with the true output, OUT_t, provided over connection 102 and the complement output "OUT_c, provided over connection 104.

The coarse tuning circuits 140 and 150 can be controlled by the signal "CN" to add additional capacitance to the circuit 100, thereby adding additional frequency range tuning. In general, the capacitive network 146 and the capacitive network 156 comprise switchable capacitances that allow a range of additional capacitance to be applied to the output of the tank circuit 120 on connections 102 and 104, respectively.

In an exemplary embodiment, the range of capacitance provided by the capacitive network 146 and the capacitive network 156 can range between zero and some finite additional capacitance. However, any capacitance added by the capacitive network 146 and the capacitive network 156 will cause the oscillation frequency of the tank circuit 120 to drop. The term "gear" refers to the additional capacitance added by the coarse tuning circuits 140 and 150, with the term "low gear" referring to a low operating frequency and a maximum additional capacitance provided by the capacitive network 146 and the capacitive network 156 and the term "high gear" referring to a high operating frequency and a minimum (or zero) additional capacitance provided by the capacitive network 146 and the capacitive network 156. The terms "low" and "high" when referring to operating frequency are relative, and may include different ranges between a low operating frequency and a high operating frequency, depending on application and circuit design. In an exemplary embodiment, the tail current, Itank, provided by the programmable DAC 110 is varied and controlled depending on the amount of additional capacitance provided by the coarse tuning circuits 140 and 150.

The circuit 100 also comprises a signal detect feedback circuit 160 that monitors the output of the circuit 100 on connections 102 and 104, and which provides a feedback signal to a digital control circuit 165 over connection 161. The digital control circuit 165 processes the feedback provided by the signal detect feedback circuit 160 and provides a digital control signal to the programmable DAC 110 over connection 162. The signal detect feedback circuit 160 monitors the oscillation amplitude of the circuit 100 and generates a feedback signal responsive to the oscillation amplitude, which is digitally processed by the digital control circuit 165 to generate the control signal on connection 162. The control signal on connection 162 is responsive to the oscillation amplitude on connections 102 and 104, and used to increase or decrease the tail current, Itank, provided by the programmable DAC 110.

As a general example, a relatively low tail current is provided in what is referred to as "high gear" when no additional capacitance is provided by the capacitive network 146 and the capacitive network 156. Conversely, a relatively high tail current is provided in what is referred to as "low gear" when most or all of the additional capacitance is provided by the capacitive network 146 and the capacitive network 156.

Figure 2:
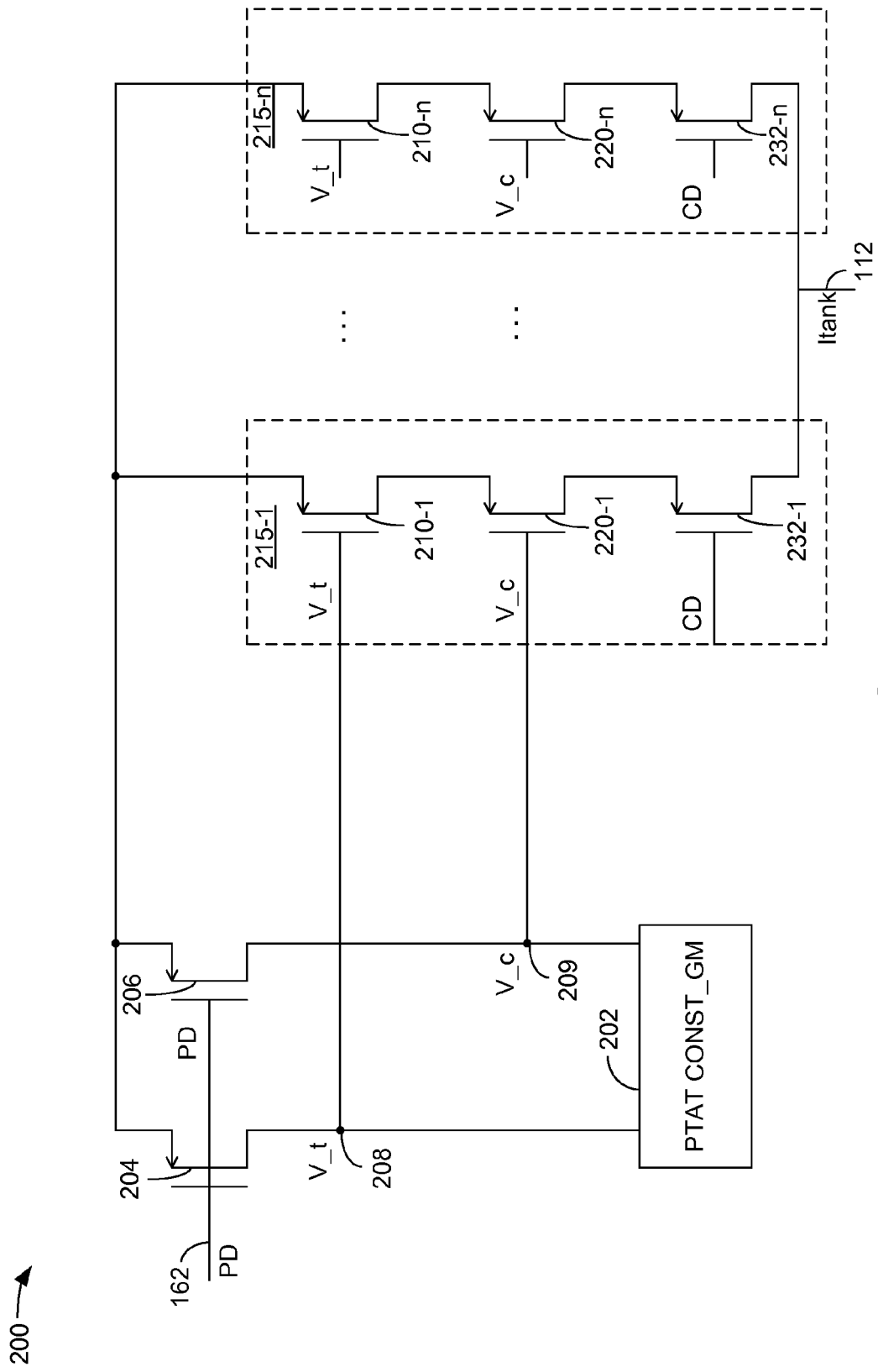
FIG. 2 is a schematic diagram illustrating an example of a programmable DAC of FIG. 1.

FIG. 2 is a schematic diagram illustrating an example of a programmable DAC of FIG. 1. The programmable DAC 200 comprises a proportional to absolute temperature (PTAT) constant gain transconductance (gm) amplifier 202 coupled to transistors 204 and 206. The transistors 204 and 206 can be p-type field effect transistor (PFET) devices in which the transistor 204 processes the "true" differential signal voltage, V_t, at node 208, and the transistor 206 processes the "complement" differential signal voltage, V_c, at node 209. A "power down" signal, PD, is provided to the gate of each transistor 204 and 206. The PD signal originates in the digital control circuit 165 (FIG. 1), and is used to adjust the tail current, Itank, provided to the LC tank 120 on connection 112.

The programmable DAC 200 also comprises transistors 210-1 through 210-n, and transistors 220-1 through 220-n. The V_t signal is provided to the gate of each of the transistors 210-1 through 210-n, and the V_c signal is provided to the gate of each of the transistors 220-1 through 220-n. The number, n, of transistors 210 and 220 is determined by the desired DAC resolution. For example, each transistor 210 and 220 may provide approximately 100 microamps (μA) of current, which currents are summed to generate the tail current, Itank, on connection 112.

The DAC 200 also comprises transistors 232-1 through 232-n. A DAC calibration signal, CD, is provided to the gate of each transistor 232. The transistors 210-1, 220-1 and 232-1 form a first current branch 215-1 and the transistors 210-n, 220-n and 232-n form an nth current branch 215-n. The signal CD is used to turn on and off the transistors 232, thereby controlling the current through the current branches 215-1 through 215-n, thereby controlling the amount of tail current, Itank, on connection 112.

The source terminals for the transistors 204, 206, and 210-1 through 210-n are connected together. The drain terminals of the transistors 210-1 through 210-n are connected to the source terminals of the transistors 220-1 through 220-n. The drain terminals of the transistors 232 are coupled together and comprise the tail current, Itank.

Below are two examples of the performance of the circuit 100 as it relates to the programmable DAC tail current assuming a fine tuning voltage sweep of 0.5V to 2.0V for the control signals, VCTRL.

Example 1

Table 1 illustrates an example using low tail current, Table 2 illustrates the frequency tuning range of the circuit 100 obtained by changing the programmable DAC tail current while sweeping the control signal, VCTRL, from 0.5V to 2.0V, and Table 3 illustrates the phase noise performance of the circuit 100 at the minimum and maximum points of the frequency tuning range obtained by changing the programmable DAC tail current.

TABLE 1

| Programmable DAC Low Tail Current Setup | | |
| --- | --- | --- |
| LC-VCO Tail Current DAC setup | DAC count | DAC Low Output Current (mA) |
| 0 0 0 0 0 0 | 0 | 1.20 |
| 0 0 0 0 0 1 | 1 | 1.22 |
| 0 1 0 0 0 0 | 16 | 1.82 |
| 1 0 0 0 0 0 | 32 | 3.65 |
| 1 1 0 0 0 0 | 48 | 5.48 |
| 1 1 1 1 1 1 | 63 | 7.20 |

At the lowest frequency setup the LC tank 120 is loaded with the highest amount of capacitance available in the capacitive network 146 and the capacitive network 156. Therefore, the tail current provided by the programmable DAC 110 is increased to sustain the desired oscillation amplitude. The circuit 100 LC-VCO should be able to pass all the process corners for the entire Tuning Range frequencies as shown in Table 2.

TABLE 2

Programmable/Low Tail Current vs. LC-VCO Tuning Frequency

| Charge Pump Vcntl (V) | LC-VCO Osc Freq. (GHz) @ Prog/Low Tail Current | LC-VCO Low Tail Current (mA) | LC-VCO Low Tail Current DAC setup | LC-VCO Osc Amp. (V) | LC-VCO Tuning Range (%) |
|---|---|---|---|---|---|
| 2.0 | 8.30 | 5.48 | 48 | 1.3 | 24 |
| 0.5 | 6.52 | 7.2 | 63 | 1.0 | |

The phase noise (PN) is measured at 1 MHz offset frequency as shown in Table 3.

TABLE 3

Programmable DAC Low Tail Current vs. LC-VCO Phase Noise

| Charge Pump Vcntl (V) | LC-VCO Osc Freq. (GHz) @ Prog/Low Tail Current | LC-VCO Low Tail Current DAC setup | LC-VCO Phase Noise @ 1 MHz offset (dBc/Hz) |
|---|---|---|---|
| 2.0 | 8.30 | 48 | −104.1 |
| 0.5 | 6.52 | 63 | −127.6 |

Example 2

Table 4 illustrates an example using high tail current, Table 5 illustrates the frequency tuning range of the circuit 100 obtained by changing the programmable DAC tail current while sweeping the control signal, VCTRL, from 0.5V to 2.0V, and Table 6 illustrates the phase noise performance of the circuit 100 at the minimum and maximum points of the frequency tuning range obtained by changing the programmable DAC tail current.

In an exemplary embodiment, about 30% additional capacitance from the capacitive network 146 and the capacitive network 156 is added into the LC tank circuit 120 to lower the lowest frequency. The coarse tune capacitance is added through the NMOS switches 141 and 152 when operating at low frequencies to add the additional capacitance via the capacitive network 146 and the a capacitive network 156. Adding MIM capacitance via the capacitive network 146 and the capacitive network 156 does not alter the high freq point when COARSE Tune=15 is selected. COARSE Tune=15 refers to a highest gear (high oscillation frequency) selection. Adding MIM capacitance via the capacitive network 146 and the capacitive network 156 increases the tuning range by lowering lower the low point of the oscillation frequency at COARSE Tune=0. COARSE Tune=0 refers to a lowest gear (low oscillation frequency) selection. The circuit 100 should be able to pass all the process corners for the entire tuning range frequencies as shown in Table 4.

TABLE 4

Programmable DAC High Tail Current Setup

| LC-VCO Tail Current DAC setup | DAC count | DAC High Output Current (mA) |
|---|---|---|
| 0 0 0 0 0 0 | 0 | 1.87 |
| 0 0 0 0 0 1 | 1 | 1.90 |
| 0 1 0 0 0 0 | 16 | 2.83 |
| 1 0 0 0 0 0 | 32 | 5.69 |
| 1 1 0 0 0 0 | 48 | 8.54 |
| 1 1 1 1 1 1 | 63 | 11.23 |

At the lowest frequency setup the LC tank 120 is loaded with the highest amount of capacitance available in the capacitive network 146 and the capacitive network 156. Therefore, the tail current provided by the programmable DAC 110 is increased to sustain the desired oscillation amplitude. The circuit 100 LC-VCO should be able to pass all the process corners for the entire Tuning Range frequencies as shown in Table 5.

TABLE 5

Programmable/High Tail Current vs. LC-VCO Tuning Frequency

| Charge Pump Vcntl (V) | LC-VCO Osc Freq. (GHz) @ Prog/Low Tail Current | LC-VCO High Tail Current (mA) | LC-VCO High Tail Current DAC setup | LC-VCO Osc Amp. (V) | LC-VCO Tuning Range (%) |
|---|---|---|---|---|---|
| 2.0 | 8.21 | 5.69 | 32 | 1.3 | 33 |
| 0.5 | 5.87 | 11.2 | 63 | 1.0 | |

The phase noise (PN) is measured at 1 MHz offset frequency as shown in Table 6.

TABLE 6

Programmable DAC High Tail Current vs. LC-VCO Phase Noise

| Charge Pump Vcntl (V) | LC-VCO Osc Freq. (GHz) @ Prog/Low Tail Current | LC-VCO High Tail Current DAC setup | LC-VCO Phase Noise @ 1 MHz offset (dBc/Hz) |
|---|---|---|---|
| 2.0 | 8.21 | 32 | −104.6 |
| 0.5 | 5.87 | 63 | −130.7 |

Figure 3:
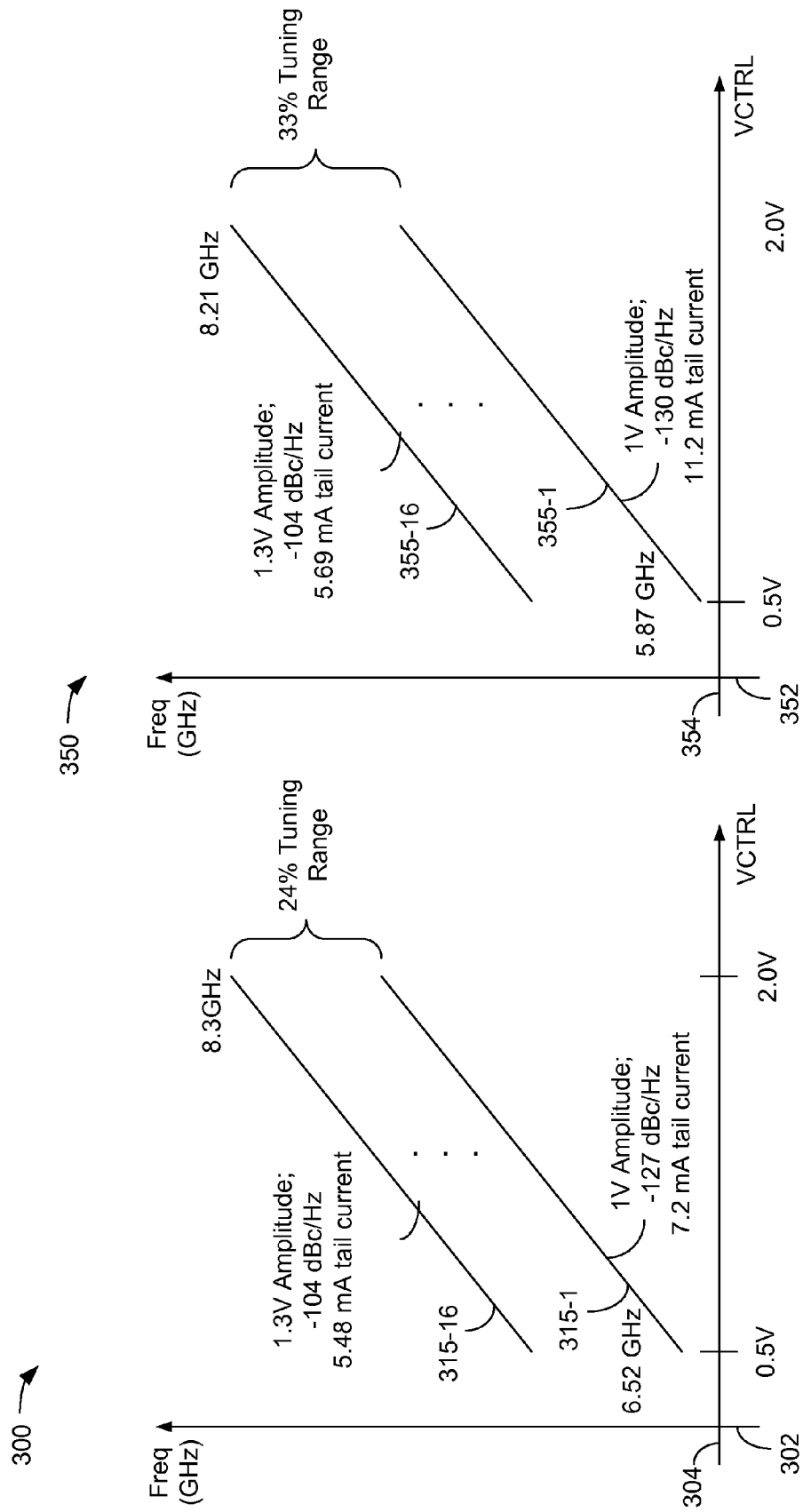
FIG. 3A is a graphical illustration showing the circuit without the adjustable DAC tail current.
FIG. 3B is a graphical illustration showing the circuit with the adjustable DAC tail current.

FIG. 3A is a graphical illustration 300 showing the circuit 100 without the adjustable DAC tail current. The horizontal axis 302 refers to the control voltage, VCTRL, and the vertical axis 304 refers to the oscillation frequency of the circuit 100 in gigahertz (GHz). The trace 315-1 refers to the operating parameter of the circuit 100 in the lowest possible gear (with all capacitors in the capacitive network 146 and the capacitive network 156 selected, which is 16 in this exemplary embodiment) and shows a 1V amplitude at −127 dBc/Hz with a tail current of 7.2 milliamperes (mA). The trace 315-16 refers to the operating parameter of the circuit 100 in the highest possible gear (with none of the capacitors in the capacitive network 146 and the capacitive network 156 selected), and shows a 1.3V amplitude at −104 dBc/Hz with a tail current of 5.48 mA. The fourteen other available curves are not shown for simplicity of illustration. As shown in FIG. 3A, the curve 315-1 shows that the lowest possible frequency of operation occurs at a control voltage, VCTRL, of 0.5V and corresponds to an oscillation frequency of approximately 6.52 GHz. The curve 315-16 shows that the highest possible frequency of operation occurs at a control voltage, VCTRL, of 2.0V and corresponds to an oscillation frequency of approximately 8.3 GHz, resulting in a tuning range of approximately 24%.

FIG. 3B is a graphical illustration 350 showing the circuit 100 with the adjustable DAC tail current. The horizontal axis 352 refers to the control voltage, VCTRL, and the vertical axis 354 refers to the oscillation frequency of the circuit 100 in gigahertz (GHz). The trace 355-1 refers to the operating parameter of the circuit 100 in the lowest possible gear (with all capacitors in the capacitive network 146 and the capacitive network 156 selected) and shows a 1V amplitude at −130 dBc/Hz with a tail current of 11.2 milliamperes (mA). The trace 355-16 refers to the operating parameter of the circuit 100 in the highest possible gear (with none of the capacitors in the capacitive network 146 and the capacitive network 156 selected), and shows a 1.3V amplitude at −104 dBc/Hz with a tail current of 5.69 mA. The fourteen other available curves are not shown for simplicity of illustration. As shown in FIG. 3B, the curve 355-1 shows that the lowest possible frequency of operation occurs at a control voltage, VCTRL, of 0.5V and corresponds to an oscillation frequency of approximately 5.87 GHz. The curve 355-16 shows that the highest possible frequency of operation occurs at a control voltage, VCTRL, of 2.0V and corresponds to an oscillation frequency of approximately 8.21 GHz, resulting in a tuning range of approximately 33%. The increase in tuning range from 24% shown in FIG. 3A to the 33% shown in FIG. 3B is a result of the programmable DAC tail current being able to be adjusted based on the performance of the circuit 100. In this example, the lower end of the tuning range has been extended from approximately 6.52 GHz shown in FIG. 3A to approximately 5.87 GHz shown in FIG. 3B.

Figure 4:
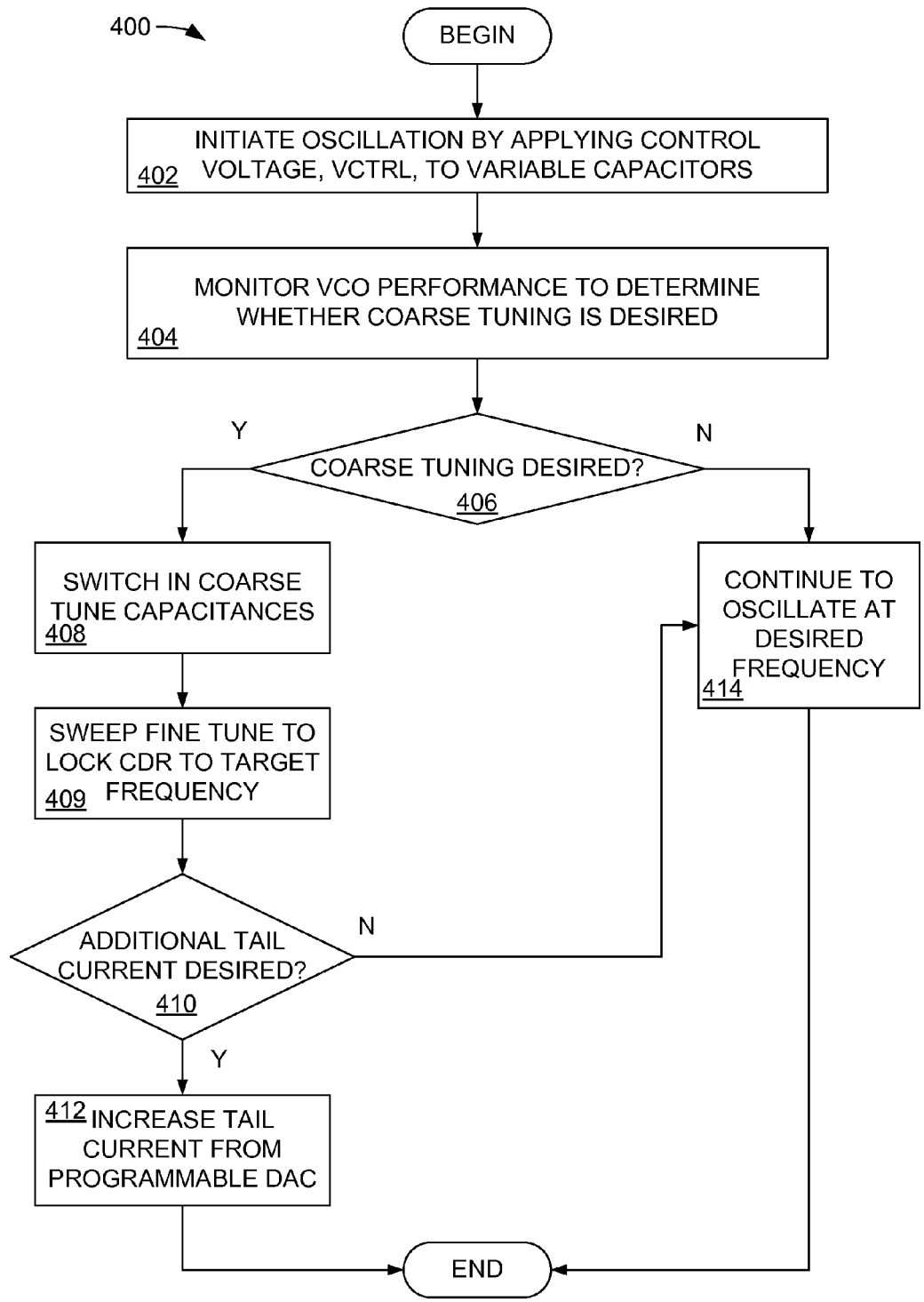
FIG. 4 is a flow chart describing an exemplary embodiment of a method for operating an LC-VCO circuit.

FIG. 4 is a flow chart describing an exemplary embodiment of a method for operating an LC-VCO circuit. In block 402, oscillation in the circuit 100 is initiated by applying a control voltage, VCTRL, to the adjustable voltage controlled capacitances 124 and 126.

In block 404, the performance of the LC-VCO circuit 100 is monitored by the signal detect feedback circuit 160.

In block 406, it is determined whether coarse tuning is desired. If coarse tuning is not desired, then in block 414, the LC-VCO circuit 100 continues to oscillate at the frequency established by the control voltage, VCTRL.

If coarse tuning is desired, then, in block 408, the transistors 141 and 151 are made conductive and the capacitive networks 146 and 156 are switched into the circuit to generate the appropriate gear and related oscillation frequency. The LC-VCO gear is determined by a clock data recovery (CDR) lock data rate. As known to those having ordinary skill in the art, to generate a CDR lock rate, a receiver generates a clock signal from an approximate frequency reference, and then phase-aligns the clock signal to the transitions in the data stream with a clock and data recovery (CDR) circuit (not shown). The clock frequency generated by the CDR has the same frequency as the maximum incoming data stream. The CDR clock is then phase-aligned with the data signal by a CDR control loop. The output of a CDR circuit includes the data steam along with the CDR clock signal, phase-aligned and frequency matched. For example, if the data rate comes to the CDR circuit at 28 Gbps then the LC-VCO should lock on 14 GHz.

In block 409, the fine tune voltage, VCTRL, is swept to lock the CDR data rate to the target frequency.

In block 410, it is determined whether additional tail current is desired. For example, the signal detect feedback circuit 160 measures the output clock signal amplitude of LC-VCO on connections 102 and 104 (FIG. 1). The expected minimum clock amplitude is defined as a reference voltage and then the signal detect feedback circuit 160 continuously checks the clock amplitude then compares and then provides high/low feedback to the digital control circuit 165. The digital control circuit 165 sends the change automatically to the programmable DAC 110 to change tail current, for example, by adding or deleting, a current leg 210, 220, 232 (FIG. 2).

If it is determined in block 410 that additional tail current is desired, then, in block 412, the programmable DAC 110 is controlled to provide the additional tail current and the process ends.

If, in block 410 it is determined that additional tail current is not desired, then the process moves to block 414, where the LC-VCO circuit 100 continues to oscillate at the frequency established by the control voltage, VCTRL, and the process ends.

This disclosure describes the invention in detail using illustrative embodiments. However, it is to be understood that the invention defined by the appended claims is not limited to the precise embodiments described.

What is claimed is:
1. A device, comprising:
a programmable digital-to-analog converter configured to generate a tail current;
an inductive-capacitive voltage controlled oscillator (LC-VCO) having a tank circuit, the tank circuit comprising:
a center-tapped inductor configured to receive the tail current from the programmable digital-to-analog converter; and
a pair of voltage-controlled capacitors coupled in parallel with the center-tapped inductor, the pair of voltage-controlled capacitors having a control voltage coupled into a node between the pair of voltage-controlled capacitors for fine tuning the tank circuit; and
a control circuit configured to provide to the programmable digital-to-analog converter a digital control signal for adjusting the tail current, wherein the digital control signal is based on an output of the LC-VCO.
2. The device of claim 1, further comprising:
a switchable capacitive network coupled to an output of the tank circuit.
3. The device of claim 2, wherein the switchable capacitive network is used to coarse-tune the oscillation frequency of the tank circuit.
4. The device of claim 2, wherein the switchable capacitive network is used to increase a tuning range of the LC-VCO by lowering a low frequency operating point of the LC-VCO.
5. The device of claim 4, wherein the switchable capacitive network does not alter a high frequency operating point of the LC-VCO when increasing the tuning range of the LC-VCO.
6. The device of claim 5, wherein the switchable capacitive network comprises switchable metal-insulator-metal (MIM) capacitors.
7. A method, comprising:
using a programmable digital-to-analog converter to generate a tail current;
generating an oscillation frequency in an inductive-capacitive voltage controlled oscillator (LC-VCO) by providing the tail current to a center-tapped inductor of a tank circuit;
fine tuning the tank circuit by varying a control voltage that is provided at a node between a pair of voltage-controlled capacitors connected in parallel with the center-tapped inductor; and
adjusting the tail current based on an amount of capacitance that is coupled to an output of the LC-VCO.
8. The method of claim 7, further comprising increasing the tail current as the amount of capacitance coupled to the output of the LC-VCO is increased.
9. The method of claim 7, further comprising using a switchable capacitive network to alter the amount of capacitance that is coupled to the output of the LC-VCO.
10. The method of claim 9, further comprising:
using the switchable capacitive network to increase a tuning range of the LC-VCO by lowering a low frequency operating point of the LC-VCO.

11. The method of claim 10, wherein the switchable capacitive network does not alter a high frequency operating point of the LC-VCO when increasing the tuning range of the LC-VCO.

12. The method of claim 11, further comprising implementing the switchable capacitive network using switchable metal-insulator-metal (MIM) capacitors.

13. A device, comprising:
  an inductive-capacitive voltage controlled oscillator (LC-VCO) having a tank circuit, the tank circuit comprising:
    a center-tapped inductor that is provided a tail current; and
    a pair of voltage-controlled capacitors coupled in parallel with the center-tapped inductor, the pair of voltage-controlled capacitors having a control voltage coupled into a node between the pair of voltage-controlled capacitors for fine tuning the tank circuit;
  a switchable capacitive network coupled to an output of the tank circuit for coarse tuning the tank circuit; and
  a programmable digital-to-analog converter configured to generate the tail current in accordance with the coarse tuning of the tank circuit.

14. The device of claim 13, wherein the tail current is increased as an amount of capacitance provided by the switchable capacitive network to the tank circuit is increased.

15. The device of claim 14, wherein increasing the tail current increases a tuning range of the LC-VCO by lowering a low frequency operating point of the LC-VCO without altering a high frequency operating point of the LC-VCO.

16. The device of claim 1, wherein the tail current is provided to the center-tapped inductor through a center tap of the center-tapped inductor.

17. The device of claim 16, further comprising a differential amplifier that includes a first transistor cross-coupled to a second transistor, a drain terminal of the first transistor connected to a first end of the center-tapped inductor and a drain terminal of the second transistor connected to an opposing end of the center-tapped inductor.

18. The method of claim 7, further comprising:
  coarse tuning the tank circuit by varying the amount of capacitance that is coupled to the output of the LC-VCO.

* * * * *